Jan. 10, 1967 E. T. COLTON 3,297,953

FREQUENCY SYNTHESIZER

Filed Feb. 1, 1965 2 Sheets-Sheet 1

INVENTOR.
EVAN T. COLTON
BY Robert J. Schiller
ATTORNEY

INVENTOR.
EVAN T. COLTON
BY
Robert J. Schiller
ATTORNEY

United States Patent Office 3,297,953
Patented Jan. 10, 1967

3,297,953
FREQUENCY SYNTHESIZER
Evan T. Colton, Lynnfield, Mass., assignor to Gordon Engineering Corporation, Watertown, Mass., a corporation of Massachusetts
Filed Feb. 1, 1965, Ser. No. 429,247
8 Claims. (Cl. 331—18)

Figure 1:
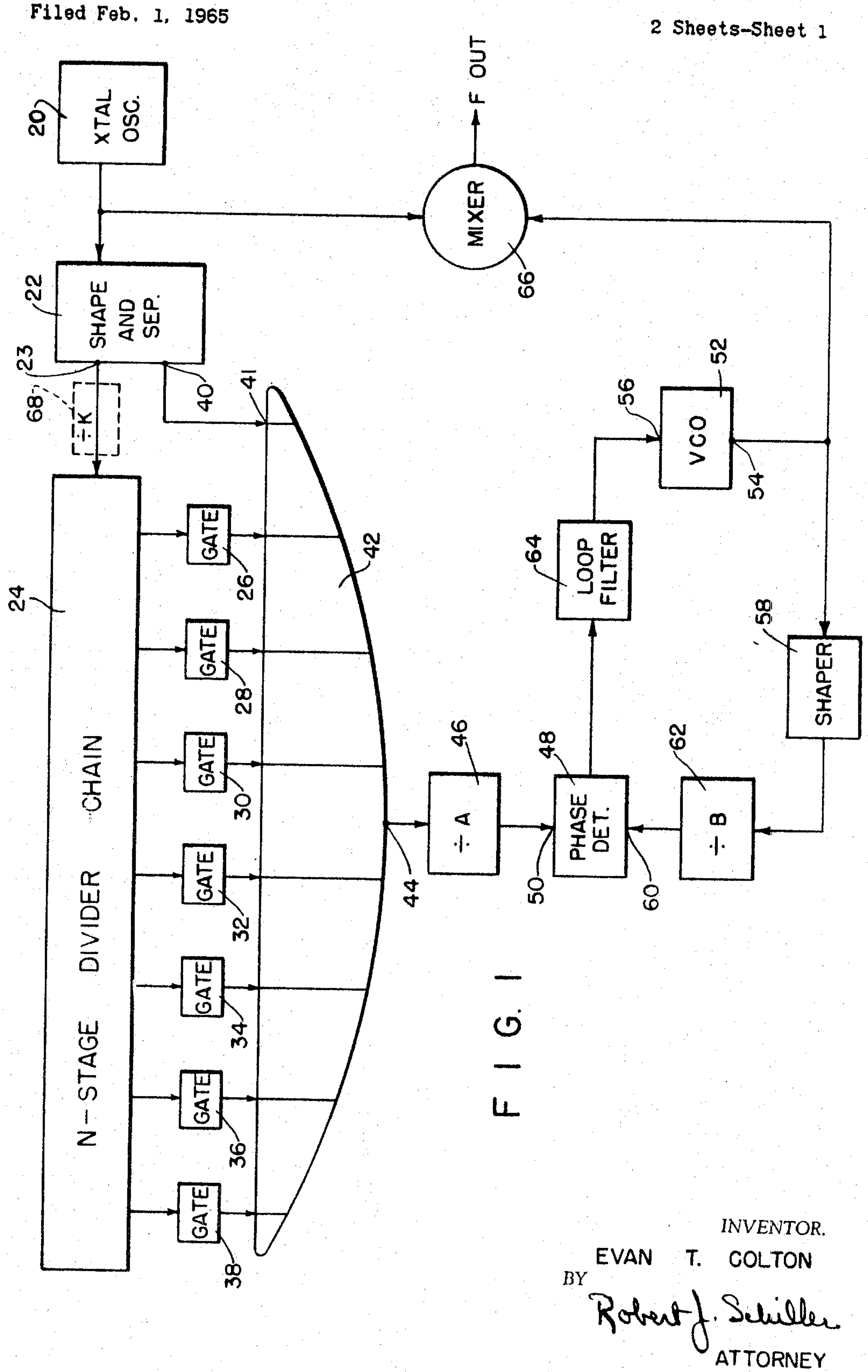

The present invention relates to variable frequency generators, and more particularly to novel apparatus for synthesizing signal frequency to an arbitrarily variable value having a predetermined number of significant digits.

A number of synthesizers have been described for generating variable frequencies defined to a specified value having a predetermined number of significant digits. Typically, in one such device, each significant digit of the output frequency is derived from the value of a predetermined fixed frequency which is then decade divided and added to second value which is that of another fixed frequency of the same order of magnitude of the first, the summed frequencies being again decade-divided and added to another fixed frequency of the same order of magnitude of the first, and so on. A frequency determined to a large number of significant digits can be provided by such a device, but the apparatus requires a number of expensive tuned circuits.

Another synthesizer employs a phase-locked loop in which a submultiple of a standard frequency is compared in phase to a submultiple of an output of a second oscillator, the latter being a voltage controlled oscillator having a frequency determined by the magnitude of the comparator output. In order that the frequency value of the voltage controlled oscillator output be defined to eight or nine significant digits, it is necessary to provide oscillators capable of operating around the microwave region, or phase comparison at very low frequencies e.g. $10^{-3}$ c.p.s.

The pesent invention has as its principal object a synthesizer which overcomes the high frequency and expense problems of the prior art and is capable of providing an output frequency whose value can be determined up to ten significant decimal digits or more, arbitrarily selected.

Other objects of the present invention are to provide a snythesizer having but one fixed-frequency source; to provide a synthesizer having both excellent long-term and short-term frequency stability; and to provide a synthesizer for generating an output frequency of value arbitrarily determined to a number of significant digits and with very low noise characteristics.

Yet other objects of the present invention are to provide a synthesizer comprising rate multiplier means for generating from a first fixed-frequency, a second frequency variable according to a predetermined digital value; phase-locked loop means for generating a third frequency in accordance with said second frequency; and means for mixing said first and third frequencies to derive an output frequency of value determined according to said digital value.

These and other such objects of the invention will in part be obvious and will in part appear hereinafter. The invention accordingly comprises the apparatus possessing the construction, combination of elements, and arrangement of parts which are exemplified in the following detailed disclosure, and the scope of the application of which will be indicated in the claims.

Figure 2:
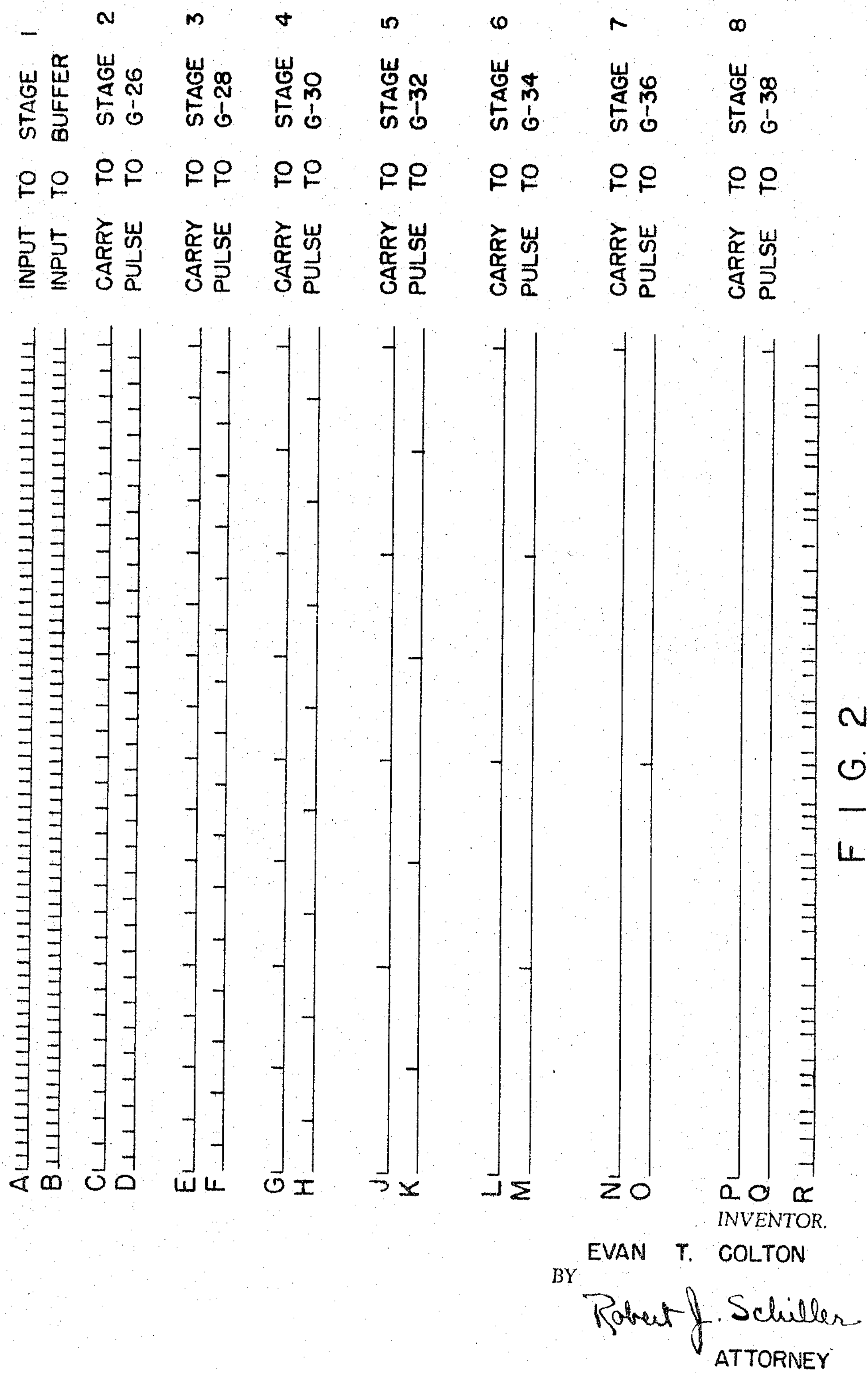

For a fuller understanding of the nature and objects of the present invention, reference should be had to the following detailed description taken in connection with the accompanying drawings wherein:

FIG. 1 is a schematic block diagram showing a logical arrangement and interconnection of elemets according to one embodiment of the invention; and FIG. 2 is a graphical timing sequence of the embodiment of FIG. 1 operated in a binary mode.

In describing the present invention, the term "frequency" is intended to be construed in its broadest sense and as embracing the repetition rate of a pulse train. Generally, the foregoing objects are achieved by an apparatus comprising a unit source of a first and fixed frequency, coupled to the input of rate multiplier means providing an output signal having a second frequency characteristic of the sum of the first frequency and the product of the first frequency and an arbitrarily selected variable numerical submultiple value having a predetermined number of significant digits. The apparatus of the present invention also includes a phase-locked loop comprising a variable frequency oscillator for generating a third frequency locked to a predetermined value in accordance with the second frequency. Mixer means are provided for generating, preferably as a difference signal, a synthesized final output frequency from the third and first frequencies.

The invention is characterized in that the final output frequency is arbitrarily variable so as to provide a wave form of excellent periodicity and high stability between frequencies as high as a substantial fraction, e.g. 10% of the first or fixed frequency and low enough to approach D.C.

Referring now to FIG. 1 in the drawing, there is illustrated by block diagram, functionally identified, an embodiment incorporating the principles of the present invention, and in which the fixed frequency source comprises oscillator 20. The latter preferably is controlled by a crystal maintained at a constant temperature, as by Zener controlled oven and provides an output frequency $F_s$, for example, a 10 mc. sinusoid. To simplify operation on the output of the crystal oscillator with flip-flops, such as are found in rate multiplier means, it is preferred to shape the output sinusoid to provide a pulse train having a repetition rate of $F_s$. To this end, the output of oscillator 20 is connected to the input of shaper 22, of known circuitry, and typically comprising an axis-crossing detector operating a known, bi-stable multivibrator for producing a rectangular wave of frequency $F_s$. Known means are included for differentiating the rectangular wave to produce pulse spikes of opposite-going polarity each of which represents respectively alternate transition slopes of the rectangular wave form. Shaper 22 preferably includes means for separating pulses of opposite polarity as by filtering the pulse through appropriate diodes so as to produce two periodic pulse trains. Thus, the pulses of one train are 180° out of phase with respect to the pulses of the other train. Where $F_s$ is 10 mc., the spacing between the pulses of respective trains is then 0.1 $\mu$seconds.

Shaper 22 is connected so that one pulse train is fed along output 23 to the input of a rate multiplier which includes a multi-stage divider chain or cascade counter 24. In its simplest form, counter 24 simply comprises a plurality of counter stages which are bistable devices or flip-flops. The number of stages in counter 24 are selected according to the number of significant digits to which it is intended to express the ultimate synthesized output frequency $F_o$ of the invention. Thus, as shown for example in FIG. 1, counter 24 comprises seven stages. Each stage typically provides a pair of output pulse trains, a train of carry pulses and a train of signal pulses, the pulses of the one train being preferably 180° out of phase with the pulses of the other. The input of each stage (except, of course, the first stage) is energized by the carry pulses from the preceding stage. Thus, depending on the numerical system by which each stage is adapted to count, each successive stage provides a lesser number of pulses at its output than the preceding stage. Where the input from the shaper is a periodic pulse train, the outputs of each stage are also periodic, the repetition rate of both the carry pulse train and the signal pulse train of a given stage being equal. For example, if each stage operates in a binary mode, each will provide a carry pulse output frequency that is one-half of the pulse frequency at its input. Thus, as shown, the seven stages of counter 24 are each provided with a respective output lead for the corresponding signal pulse train output, each output lead being connected to a respective one of gates 26, 28, 30, 32, 34, 36, and 38.

Each gate can be simply a manually operated switch or an electrically operated coincidence or AND gate or the like, whereby the gate can be selectively enabled or disabled so as to pass or inhibit passage of its input signal pulse train. Means, such as buffer 42, are provided so that the outputs of all of the gates are coupled, together with the other pulse train from output 40 of shaper 22 which is applied to input 41 of buffer 42, and the combined signal is presented at buffer output 44 without interaction between the outputs of the gates and the shaper.

The operation of the rate multiplier means thus described can be explained more clearly with reference to a specific embodiment. For example, it can be assumed that the pulse train at output 23 of shaper 22 is at frequency $F_s$ and as detailed in FIG. 2A. The pulse train of FIG. 2B is then also at frequency $F_s$ (but 180° out of phase with FIG. 2A) and represents the signal at output 40 of shaper 22. It will be apparent that if the stages of counter 24 are operated in a binary mode, the frequencies of the inputs to gates 26 to 38 respectively will be $F_{s/2}$, $F_{s/4}$, $F_{s/8}$, $F_{s/16}$, etc. the input frequency to the $n^{th}$ gate being expressed as $F_{s/2}n-1$. Thus, as shown in FIG. 2C, the frequency of the train of carry pulses at the input of the second stage is one-half that of the train at output 23, the train of signal pulses from the first stage to gate 26 being at the same frequency but shifted in phase as shown in FIG. 2D. Similarly, the train of carry pulses at the input of the third stage as shown in FIG. 2E have a frequency one-half that of the input frequency to the preceding stage, the signal pulse output train of the latter being also at the same one-half input frequency but phase-shifted and shown in FIG. 2F. In like manner, FIGS. 2G and 2H respectively show the carry pulse train and signal pulse train from the third stage, and FIGS. 2J through 2Q shows the pairs of trains from the next four stages respectively. There being no eighth stage, of course, the carry output from stage 7 (as shown in FIG. 2P) is superfluous.

It is intended that the gates be controlled in accordance with an arbitrarily selected variable numerical submultiple value Y which in this instance could be a binary number having the same number of significant digits as the number of gates. Thus, each gate is enabled or disabled according as the corresponding digit of the binary number is 1 or 0. For example, if the enabled condition of a gate represents binary 1, and the arbitrary number Y is 1011010, gates 26, 30, 32, and 36 would be enabled and buffer 42 will provide at its output the paralleled signals from those gates together with the pulse train from output 40. In such case, the pulse train at output 44 would have the average frequency of $$F_s+F_{s/2}+F_{s/8}+F_{s/16}+F_{s/64}$$

The frequency of the output train of buffer 42 can be expressed more generally as:

$$F_B=X(1+Y)=X+X\sum_1^n\frac{Yn}{2^n}$$

where X is the pulse repetition rate $F_s$ of the input pulse train to the counter (or to the buffer from output 40) and $Y_n$ represents the digit of $n^{th}$ significance in the arbitrarily selected binary submultiple Y.

It is imperative that no two pulses being buffered to output 44 occur simultaneously, since the pulse train at output 44 is the sum of a number of time sequenced pulses. This can be accomplished by taking the carry pulses from one side of each bistable element or counter stage whilst utilizing the other side of the stage to provide the desired signal pulses, and by shifting the phase of the pulses in the train from output 40. As will be seen in FIG. 2R, the sum of all the gate outputs and the train from output 40 is a pulse train in which each pulse is derived from a unique time position and thus no merging of pulses occurs. The train of FIG. 2R, although derived from a number of periodic pulse trains, is of itself aperiodic although its average frequency is the product hereinbefore described. This pattern of aperiodic pulses is quite independent of the frequency of the pulse trains fed to buffer 42 although the stability of its average frequency is dependent upon the stability of the frequency of the ouput of oscillator 20. Rate multiplier means similar to those described in more detail in U.S. Patent No. 2,910,237 issued October 27, 1959 to M. A. Meyer and B. A. Gordon, but the latter is intended to provide an output frequency which is an XY type of product rather than the $X(1+Y)$ type of sum and product found in the present invention.

Output 44 of buffer 42 is coupled to the input of proportioning counter or divider 46, the output of the latter being connected into a phase-locked loop. The latter comprises phase detector 48 having one comparator input terminal 50 connected to the output of divider 46. Detector 48 can be one of a number of known circuits which typically operates to compare the phase of two oscillatory input signals and develops an output voltage having a D.C. component proportional to the difference in phase between the signals. However, when the signals to be compared are pulse trains (the time spacing between adjacent pulses being the analogue of phase angle between sinusoidal waves) as in the embodiment described, the phase detector can be simply a flip-flop having set and reset input terminals as the comparator terminals coupled to respective pulse trains.

The phase-locked loop further includes voltage controlled oscillator 52 for providing an output waveform, preferably sinusoidal, at output terminal 54, the frequency of the output being a monotonic function of the magnitude of a D.C. control voltage applied within limits at control terminal 56. Means, such as shaper 58 are included for converting the waveform of the output of oscillator 52 to a periodic pulse train having a repetition rate that is a substantially linear function of the variable frequency oscillator. The output of shaper 58 is connected to the other comparator input terminal 60 of phase detector 48 through a second proportioning counter or divider 62 so that only a submultiple of the output frequency of oscillator 52 is applied to terminal 60.

The phase-locked loop is completed by filter means 64 having an input connected to the output of detector 48, and having its output connected to the voltage control terminal of oscillator 52. Oscillator 52 and 20 are both also connected to respective input terminals of means, such as mixer 66, for deriving a beat or difference frequency from the two input waveforms.

The operation of the phase-locked loop in cooperation with the rate multiplier and mixer can be advantageously described in connection with the specific embodiment hereinbefore detailed in part. Thus, the average frequency output of the rate multiplier appearing at terminal 44 varies according to the binary number selected for Y, from the value of $F_s$ to $2F_s$ as a limit. The signal at terminal 44 is divided by the denominator A provided by divider 46 so that the average pulse repetition rate of the signal at terminal 50 of detector 48 is then $F_B/A$.

The phase-locked loop functions as a feed-back system tending to null any frequency difference between the signals at terminals 50 and 60. When the average frequencies of the signals at both terminals 50 and 60 are not identical, the D.C. component of the phase detector output voltage is such as to drive oscillator 52 toward a frequency that is identical. The frequency $F_C$ of the output signal from oscillator 52 is, at balance $F_C$ such that $F_C/B=F_B/A$ where B is a denominator provided by divider 62, and if $B=A$, then $F_C=F_B=F_S(1+Y)$.

While due to the action of the phase-locked loop, the two pulse trains at its input terminals are of the same average frequency, the pulse train from oscillator 52 is periodic but the pulse train from buffer output 44 is aperiodic (assuming that any one or more of the gates are enabled).

The D.C. component in the output signal from detector 48 is derived by filter 64 which serves to rectify or integrate the rectangular wave characteristic of the output of detector 48. The time spacing between pulses at respective comparator terminals of the detector determines the duration of each rectangular wave in the output of detector 48. The shorter the spacing, the lower is the integrated value and the D.C. component applied to oscillator 52 is correspondingly reduced in magnitude.

It will be appreciated that the rectangular wave output of detector 48 reflects the short-term aperiodicity of the output of buffer 42. Because at frequencies such as 10 mc. (advantageously established as the standard output of oscillator 20), the rise and fall time of the rectangular wave form of the output of detector 48 becomes a significant factor in the value of the D.C. component provided by filter 64, it is preferred to proportion the repetition rates of the pulse trains to the phase detector. To this end, dividers 46 and 58 can be simple reducing or scaling counters capable of dividing the input frequency by, for example, a factor of $R^4$ where R is the radix of the numerical system employed.

For example, using typical values for a decade divider system (e.g. 10 mc. for the output of oscillator 20, 10 to 20 mc. for the output of oscillator 52, and $A=B=10^4$) it will be appreciated that the main or full rippel component in the input to filter 64 is then in the 1–2 kc. range and can easily be filtered out. Aperiodicity of the output of the buffer introduces lower frequency ripple in the output of the phase detector; for example, the pulses from gate 36 will introduce a $10^{-3}$ c.p.s. component at the phase detector. However, the latter has an extremely small effect on the D.C. amplitude of the phase detector output, and can be shown to be only about $10^{-14}$ of the value of the effect of the 1–2 kc. fundamental ripple on the phase detector output. At the foregoing oscillator frequencies, the effect of ripple components around 1 c.p.s. will be about $10^{-7}$ of the value of the fundamental ripple and can be filtered by no more than a 100 sec. filter formed, for example, of a 100 microfarad capacitor and 1 megohm resistor. Thus, ripple in the detector output due to short term aperiodicity of the buffer output can be readily smoothed so as to introduce no substantial error into the D.C. voltage signal controlling oscillator 52.

The sine wave signals from oscillators 20 and 52 being respectively $F_s$ and $F_S(1+Y)$, when beat together in mixer 66 will provide a difference signal of frequency determined quite accurately to the numerical value and number of significant digits of Y. Noise (as frequency variation) is very low in the final output, as is the frequency stability both long-term (days or greater), which depends only on output of oscillator 20, and short-term (seconds or less), which depends only on the output of oscillator 52.

It will be appreciated that $F_S(1+Y)$ can vary in the limit between the $F_s$ and $2F_s$, if Y can be any fraction. In some instances this imposes rather severe demands upon a variable oscillator of good short-term stability as is desired for oscillator 52. Thus, as shown in broken lines in FIG. 1 in such instances scaling divider or counter 68 is preferably inserted between output 23 of shaper 22 and the input of counter 24. If counter 68 provides an output fraction $1/K$ of input $F_s$ then the frequency swing required of oscillator 52 will be, in the above example, between $F_s$ and $$F_s\left(1+\frac{Y}{K}\right)$$

Thus, if K is 10, for example, Y can be any fraction between the limits zero and unity, whilst the total range for F is only between $F_s$ and $1.1F_s$.

A specific numerical example may be helpful in understanding the operation of the invention as a binary device. For example, one can assume the previous stated values of 10 mc. for the output of oscillator 20, 10–20 mc. for the output of oscillator 52, and $A=B=10^4$. Now let us assume that one wishes to obtain an $F_{out}$ of 6.72 mc. This can be approximated as the sum of the series $$\frac{F}{2}+\frac{F}{8}+\frac{F}{32}+\frac{F}{64}$$

or, if F is 10 mc., (5+1.25+.3125+.156) mc. Thus, Y is such a sum and, in binary notation is .1010110. Applying the 10 mc. output of oscillator 20 to divider chain, the latter divides down the input to provide a number of parallel output pulse trains. These parallel pulse trains have pulse repetition rates which are fractions of the input frequency F according to the binary sequence $$\frac{F}{2}, \frac{F}{2^2}, \frac{F}{2^3}, \frac{F}{2^4}, \cdot \quad \frac{F}{2^n}$$

Each pulse train is applied to respective gates arranged to be activated by successive digits of Y. Thus, the gate controlled by most significant digit of Y therefore passes a pulse train of 5 mc. Similarly, gates 30, 34, and 36 are enabled passing their respective pulse trains of 1.25 mc., .3125 mc., and .156 mc. All other gates corresponding to the zero in the binary numeral Y are disabled. All of the pulse trains passed are combined at buffer 42 with the 10 mc. signal from output 40, thereby yielding a pulse train with an average frequency of 16.72 mc.

This is divided down by divider 46 so that the signal applied to input 50 of phase detector 48 is 1.672 kc. As previously explained, the phase locked loop will function so that the output of voltage controlled oscillator 52, as divided by counter 62 and applied at terminal 60, is driven to match the average frequency of 1.672 kc. It will be appreciated then that when the difference between the average frequency of the signals at terminals 50 and 60 of the phase detector has been nulled, the output of oscillator 52 will also be 16.72 mc. The latter is mixed in mixer 66 with the 10 mc. signal from oscillator 20 to provide the resulting difference signal which, of course, is 6.72 mc. as desired.

While the embodiment of the invention has been described for the most part herein as operating in a binary mode, it will be apparent that it is equally operable according to other number systems. For example, counter 24 could be formed of decade counter stages operable to provide a decade (as herein described in connection with the numerical example outlining the filter requirements), rather than binary, coded output. In such case the binary gates, such as 26 and the like, could be decade gating circuits such that the factor Y as a decimal number could be directly impressed on the gates.

Since certain changes may be made in the above apparatus without departing from the scope of the invention herein involved it is intended that all matter contained in the above description or shown in the accompanying drawing shall be interpreted in an illustrative and not in a limiting sense.

What is claimed is:

1. Frequency synthesizer apparatus comprising, in combination:

means adapted to have a periodic clock signal applied at the input thereof for producing an aperiodic pulse train having an average pulse rate which is the product of the frequency value of said periodic clock signal and an arbitrary numerical multiplier value;

a phase-locked loop comprising a voltage controlled oscillator and phase detector means connected to the output of the pulse train producing means, said oscillator and phase detector means being connected to one another for providing from said phase detector means a voltage which is a function of the average time relation between the output frequency of said oscillator and said pulse train so as to control the frequency of the output of said oscillator; and means for deriving a beat frequency between said clock signal and said oscillator output.

2. Frequency synthesizer apparatus comprising, in combination:

means adapted to have a periodic clock signal applied at the input thereof for producing an aperiodic pulse train having an average pulse rate which is the sum of the frequency of said periodic clock signal and the product of said frequency and an arbitrarily selected numerical submultiple value;

a phase-locked loop comprising a voltage controlled oscillator and phase detector means connected to the output of the pulse train producing means, said oscillator and phase detector means being connected to one another for providing from said phase detector means a voltage which is a function of the average time relation between the output frequency of said oscillator and said pulse train so as to control the frequency of the output of said oscillator; and means for deriving a beat frequency between said clock signal and said oscillator output.

3. Frequency synthesizer apparatus comprising, in combination:

means adapted to have a periodic clock signal applied at the input therefor for producing an aperiodic pulse train having an average pulse rate which is the sum of the frequency of said periodic clock signal and the product of a fixed fraction of said frequency and an arbitrarily selected fixed submultiple value;

a phase-locked loop comprising a voltage controlled oscillator and phase detector means connected to the output of the pulse train producing means, said oscillator and phase detector means being connected to one another for providing from said phase detector means a voltage which is a function of the average time relation between the output frequency of said oscillator and said pulse train so as to control the frequency of the output of said oscillator; and means for deriving a beat frequency between said clock signal and said oscillator output.

4. Frequency synchronizer apparatus comprising, in combination:

clock means for generating a first train of periodic signals having a first predetermined frequency;

means connected to said clock means for producing a second train of signals having an average frequency which is the product of said first predetermined frequency and an arbitrarily selected numerical submultiple value;

means for combining said second train of signals with said first train so as to provide at its output a third train of signals having an average frequency equal to the sum of said first frequency and said product;

a phase-locked loop comprising phase detector means having a pair of comparator inputs one of which is coupled to the output of said combining means, a voltage controlled oscillator for providing an output signal of frequency controlled in accordance with an input voltage signal and having its output connected to the other comparator input of said phase detector means, and filter means connected between the output of said phase detector means and the voltage controlled input of said oscillator for providing said voltage signal as a substantially monotonic function of the average time relation between the output frequencies of said oscillator and said combining means; and means for deriving a beat frequency between said first predetermined frequency and the output frequency of said oscillator.

5. Frequency synchronizer apparatus comprising, in combination:

clock means for generating a first train of periodic signals having a first predetermined frequency;

means connected to said clock means for producing a second train of signals having an average frequency which is the product of a selected fraction of said first frequency and an arbitrarily variable, numerical submultiple value;

means for combining said second train of signals with said first train so as to provide at its output a third train of signals having an average frequency equal to the sum of said first frequency and said product;

a phase-locked loop comprising phase detector means having a pair of comparator inputs, first frequency divider means connected between the output of said combining means and one of said comparator inputs, a voltage controlled oscillator for providing an output signal of frequency controlled in accordance with an input voltage signal, a second frequency divider means connected between the output of said oscillator and the other of said comparator inputs, and filter means connected between the output of said phase detector means and the voltage controlled input of said oscillator for providing said voltage signal as a substantially monotonic function of the average time relation between the output frequencies of said oscillator and said combining means; and means for deriving a beat frequency between said first predetermined frequency and the output frequency of said oscillator.

6. Frequency sychronizer apparatus comprising, in combination:

clock means for generating a train of periodic signals having a first predetermined frequency;

a multi-stage cascaded counter having its input stage connected to said clock means, each sequential counter stage being adapted to deliver both output and carry pulses out of phase with one another and having an input energized by carry pulses from the preceding stage and an output for producing said output pulses at a lesser rate than can be provided from the output of the preceding stage, a plurality of gate circuits each of which corresponds to and is connected to the output of a respective one of said stages, each of said gates being controllable in accordance with a signal representing a respective one of the digits of an arbitrary numerical value, and buffer means for combining the outputs of said gate circuits and of said clock means into an aperiodic pulse train having an average pulse rate which is the product of said first predetermined frequency and said arbitrary numerical value;

a phase-locked loop comprising a voltage controlled oscillator and phase detector means connected to one another for providing from said phase detector means a voltage which is a function of the average time relation between the output frequency of said oscillator and the average frequency of said aperiodic pulse train so as to control the frequency of the output of said oscillator; and means for deriving a beat frequency between said periodic signal from said clock means and said oscillator output.

7. Frequency synchronizer apparatus comprising, in combination:

clock means for generating a train of periodic signals having a first predetermined frequency;

a multi-stage cascaded counter having its input stage connected through a scaling divider to said clock means, each sequential counter stage being adapted to deliver both output and carry pulses out of phase with one another and having an input energized by carry pulses from the preceding stage and an output for producing said output pulses at a lesser rate than can be provided from the output of the preceding stage, a plurality of gate circuits each of which corresponds to and is connected to the output of a respective one of said stages, each of said gates being controllable in accordance with a signal representing a respective one of the digits of an arbitrary numerical value, and buffer means for combining the outputs of said gate circuits and of said clock means into an aperiodic pulse train having an average pulse rate which is the product of said arbitrary numerical value and the fraction of said first frequency as determined by said scaling divider;

a phase-locked loop comprising a voltage controlled oscillator and phase detector means connected to one another for providing from said phase detector means a voltage which is a function of the average time relation between the output frequency of said oscillator and the average frequency of said aperiodic pulse train so as to control the frequency of the output of said oscillator; and means for deriving a beat frequency between said periodic signal from said clock means and said oscillator output.

8. Frequency synchronizer apparatus comprising, in combination, clock means for generating a train of periodic signals having a first predetermined frequency;

a multi-stage cascaded counter having its input stage connected to said clock means, each sequential counter stage being adapted to deliver both output and carry pulses out of phase with one another and having an input energized by carry pulses from the preceding stage and an output for producing said output pulses at a lesser rate than can be provided from the output of the preceding stage, a plurality of gate circuits each of which corresponds to and is connected to the output of a respective one of said stages, each of said gates being controllable in accordance with a signal representing a respective one of the digits of an arbitrary numerical value, and buffer means for combining the outputs of said gate circuits and of said clock means into an aperiodic pulse train having an average pulse rate which is the product of a selected fraction of said first predetermined frequency and said arbitrary numerical value;

a phase-locked loop comprising phase detector means having a pair of comparator inputs one of which is coupled to the output of said buffer means, a voltage controlled oscillator for providing an output signal of frequency controlled in accordance with an input voltage signal and having its output connected to the other comparator input of said phase detector means, and filter means connected between the output of said phase detector means and the voltage controlled input of said oscillator for providing said voltage signal as a substantially monotonic function of the average time relation between the output frequencies of said oscillator and said buffer means; and means for deriving a beat frequency between said first predetermined frequency and the output frequency of said oscillator.

No references cited.

ROY LAKE, *Primary Examiner.*

S. H. GRIMM, *Assistant Examiner.*